United States Patent [19]

Kihara et al.

[11] 4,428,066

[45] Jan. 24, 1984

[54] SEMICONDUCTOR READ ONLY MEMORY

[75] Inventors: Kazuo Kihara, Tokyo; Masashi Ikeda, Urawa, both of Japan

[73] Assignee: Tokyo Shibaura Denki Kabushiki Kaisha, Kawasaki, Japan

[21] Appl. No.: 256,666

[22] Filed: Apr. 22, 1981

[30] Foreign Application Priority Data

Jun. 2, 1980 [JP]  Japan .................................. 55-72726

[51] Int. Cl.³ ............................................ G11C 11/36
[52] U.S. Cl. ...................................... 365/96; 365/105; 340/825.84; 357/51
[58] Field of Search .................... 340/825.84; 365/94, 365/96, 100, 103, 104, 105; 357/51

[56] References Cited

U.S. PATENT DOCUMENTS 3,792,319  2/1974  Tsang .......................... 340/825.84 X
3,863,231  1/1975  Taylor ................................. 365/96
4,195,354  3/1980  Kruzhanov et al. ................ 365/105

*Primary Examiner*—Joseph A. Popek
*Attorney, Agent, or Firm*—Cushman, Darby & Cushman

[57] ABSTRACT

A semiconductor fused programmable read only memory having a fuse resistor formed on an insulator film of the surface of a substrate. An island region having a conductivity opposite to that of the surrounding region is formed below the fuse resistor for avoiding excess current flow through the substrate.

5 Claims, 5 Drawing Figures

FIG. 1
(PRIOR ART)
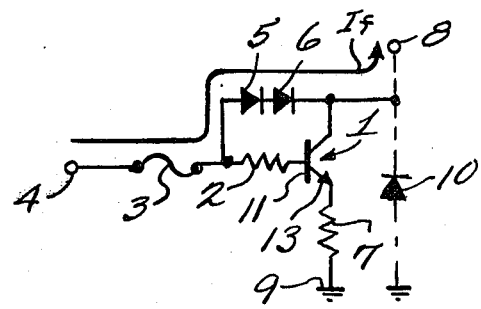
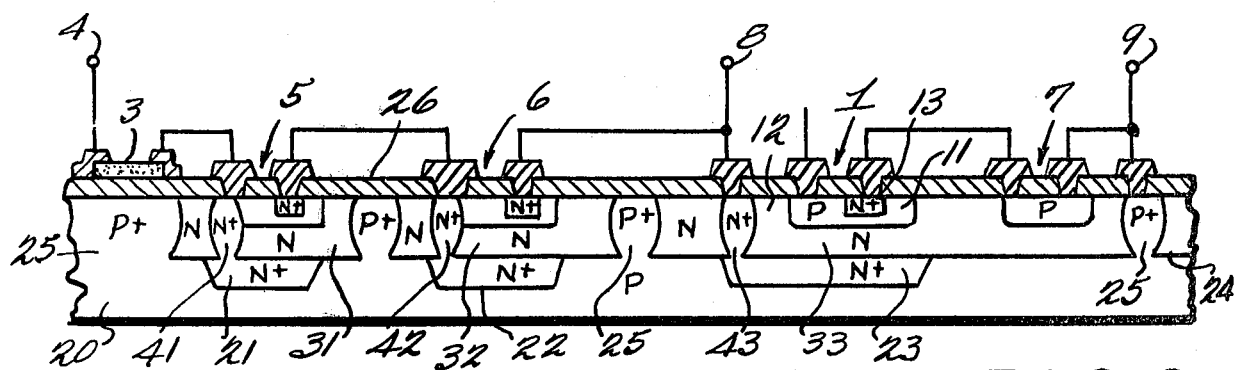
FIG. 2
(PRIOR ART)
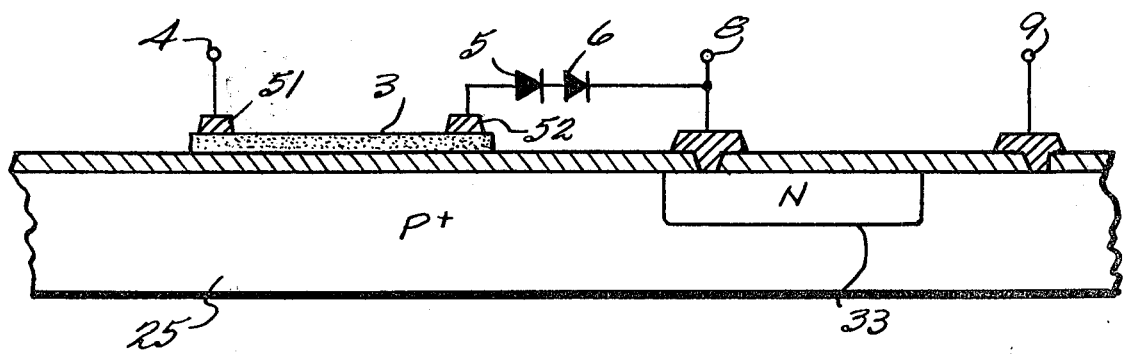
FIG. 3
(PRIOR ART)

3,428,066

SEMICONDUCTOR READ ONLY MEMORY

BACKGROUND OF THE INVENTION

This invention relates to a semiconductor read only memory, more particularly to a fused programmable read only memory capable of avoiding destruction of the surface thereof. A fused programmable read only memory (PROM) typically uses polycrystalline silicon, aluminium, nichrome, or molybdenum, etc. as a fuse material. Writing of data into the fused PROM is performed by opening or shorting electrical fuses connected to transistors which are positioned at cross points of a memory matrix. Fuses are melted and cut or oxydized and shorted by electric power applied to the fuses.

FIG. 1 illustrates an example of a one bit circuit diagram used in a fused PROM. Base 11 of a bipolar transistor 1 is connected to an X bit line terminal 4 through a base resistance 2 and a fuse 3. Collector 12 of transistor 1 and diodes 5 and 6 forming a main writing current path If are connected to Y bit line terminal 8. Emitter 13 of transistor 1 is connected to a ground terminal 9 through an emitter resistance 7. Fuse 3 is melted and cut by current If to open ground terminal 9 and to apply the plus voltage to Y bit line terminal 8 against X bit line terminal 4. Transistor 1 is not operated in the saturating condition by opening fuse 3, so the output of Y bit line terminal 8 is a "1" level. Other transistors having unopened fuses provide "0" levels.

FIG. 2 illustrates a sectional view of an integrated circuit including the device shown in FIG. 1. Bipolar transistor 1, fuse 3, X line terminal 4, diodes 5 and 6, emitter resistance, Y line terminal 8 and ground terminal 9 are as shown in FIG. 1 except the path between fuse 3 and base 11 through base resistance 2 is deleted for purposes of illustration.

N+ buried regions 21, 22 and 23 are selectively formed in a P silicon substrate 20, and an N epitaxial layer 24 is formed on substrate 20. N epitaxial layer 24 is separated 1y P+ dam regions 25 and island regions 31, 32 and 33 are formed. N+ connection regions 41, 42 and 43 are formed on N+ buried regions 21, 22 and 23. PN+ type diodes 5 and 6 and NPN type transistor 1 are formed in island regions 31, 32, and 33, respectively. Fuse resistor 3 is provided on P+ dam region 25 through an oxide film 26.

Fuse resistor 3 is made of, for example, polycrystalline silicon. This fuse construction is better than the inner diffusion fuse, because writing is easy and the influence of parasitism capacity 10 (shown in FIG. 1) is decreased. The resistive value of fuse resistor 3 is set by the addition of the impurity. Fuse resistor 3 is also arranged on the surface of substrate 20 opposite to P+ dam region 25 connected to ground terminal 9.

FIG. 3 illustrates an electrically equivalent and simplified sectional view of FIG. 2 to explain the current path If produced by the writing voltage. Plus potential Vw is applied to X line terminal 4 against Y line terminal 8. If the forward voltage drop of parasitic diode 10 (shown in FIG. 1) formed by P+ dam region 25 and island region 33 is Vf, the voltage drops of both electrodes of fuse resistor 3 against P+ dam region 25 are (Vw−Vf) and Vf, respectively. Generally, (Vw−Vf) Vf. The temperature increase of fuse resistor 3 when melted and cut by the writing voltage Vw reaches 1200 to 1500 degree C.

As the result, the temperatures of fuse resistor 3 and the neighborhood of electrodes 51 and 52 are very high. There are cases where dielectric breakdown occurs between electrode 51 and P+ dam region 25 under the high temperature and the high electric field, so electrode 51 and P+ dam region 51 are shorted. Often when fuse 3 is destroyed, aluminium wiring is burned and broken, too. The reasons for the above-mentioned destruction are in the melting-diffusion from the temperature of fuse 3 and the inferiority of the dielectric strength of aluminium wiring. The tendency of aluminium wiring to burn is closely related to its dielectric strength. For example, aluminium wiring is not burned and stable data writing is possible when voltage Vw to melt fuse 3 is applied to electrodes 51 and 52 only.

However, aluminium wiring is often burned and broken by the short between electrode 51 and P+ dam region 25 when a high electric field exists between electrode 51 and P+ dam region 25. Data writing inferior ratios reach tc 5 to 20% when the thickness of oxide film 26 is 45° Angstroms, applied voltage Vw is 25 volts and Vf is 0.7 volts. The dielectric strength of the oxide silicate film drops to less than 25 volts under the special circumstance of high temperature although it is near 70 volts/1000 Angstrms at room temperature.

This problem is improved by using thick oxide film 26, but the opening of electrode holes is difficult and aluminium wiring is still cut near the edges of holes of the thick oxide film.

OBJECT AND SUMMARY OF THE INVENTION

An object of this invention is to provide an improved semiconductor fused programmable read only memory for preventing destruction of the surface thereof.

The semiconductor fused programmable read only memory according to the invention includes a fuse resistor provided on the surface of a semiconductor chip through the insulator film. An island region is formed on the surface of the chip below the fuse resistor and being of opposite conductivity from the surrounding region. The island region works as a buffer region to prevent leakage current and generation of a high electric field.

BRIEF DESCRIPTION OF THE DRAWINGS

This and other objects and advantages of the invention will become more apparent and more readily appreciated from the following detailed description of the presently referenced exemplary embodiment of the invention taken in conjunction with the accompanying drawings, of which:

FIG. 1 is a one-bit circuit diagram of a conventional fused PROM;

FIG. 2 is a sectional view of a conventional fused PROM;

FIG. 3 is an electrically equivalent and simplified sectional view of FIG. 2;

DETAILED DESCRIPTION OF THE PREFERRED EMBODIMENTS

Figure 4:
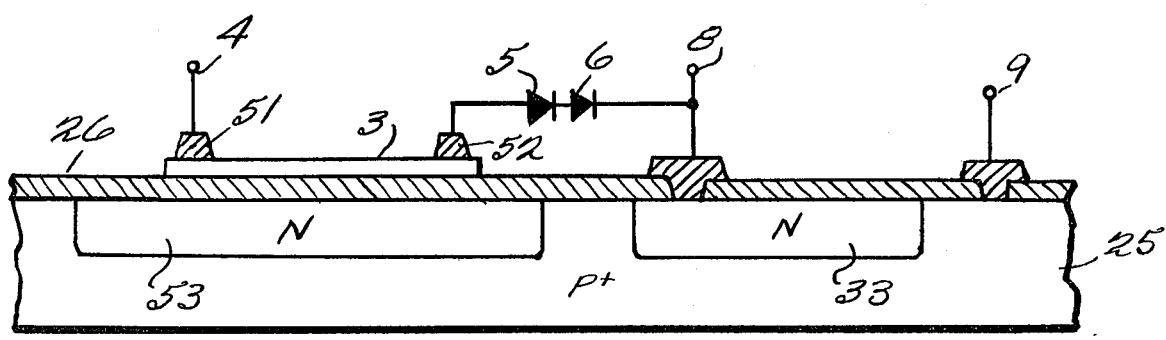
FIG. 4 is a sectional view of an embodiment of the invention.
Figure 5:
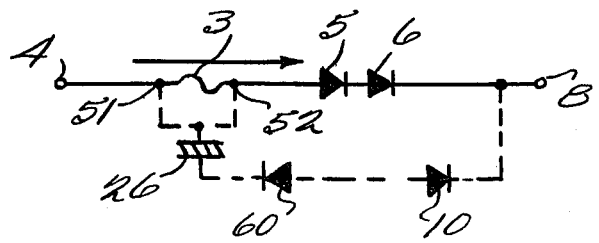
FIG. 5 is an electrically equivalent circuit diagram of FIG. 4.

Referring now in particular to the drawings, wherein like reference characters designate like or corresponding parts throughout the several views, FIG. 4 corresponds to FIG. 3 and FIG. 5 is an equivalent circuit of FIG. 4. The difference of FIG. 4 from FIG. 3 is that an island region 53 is formed below and face to face with fuse resistor 3 including electrodes 51 and 52. The conductivity of island region 53 is N type which is opposite to the conductivity of the surrounding region connected to ground terminal 9.

Referring now to FIG. 5, oxide film 26 and a parasitic diode 60 formed between island region 53 (shown in FIG. 4) and P+ dam region 25 (shown in FIG. 4) are written below fuse resistor 3. The main current path for bit writing is shown by the arrow line, namely x bit line 4—fuse resistor 3—diodes 5 and 6—Y bit line 8.

In this embodiment of the invention, the succeeding ratio of the data writing is increased to 100%, and the burning of aluminium wirings is completely avoided. This is due not only to the increase of reliability of the data writing caused by parasitic diode 60 but also by N island region 53 which serve as a buffer region to metal diffusion at high temperature.

Materials of fuse resistor 3 include aluminium, nichrome or molybdenum. The semiconductor elements arranged at the cross points of the memory matrix can be diodes or MOS transistors.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A semiconductor fused read only memory (ROM) comprising:
    a substrate of a first conductivity type;
    an insulator film formed on a surface of said substrate;
    a plurality of doped regions cooperating with said substrate to form semiconductor elements;
    a fuse resistor formed on said insulator film and connected in circuit with said semiconductor elements to form said memory;
    an island region of a second conductivity type opposite to said first conductivity type, formed within said substrate and extending below all of said fuse resistor, said island region being defined by PN junctions from said substrate.

2. A semiconductor fused ROM according to claim 1, wherein said fuse resistor is made of polycrystalline silicon.

3. A semiconductor fused ROM according to claim 1, wherein said fuse resistor is made of aluminum.

4. A semiconductor fused ROM according to claim 1, wherein said fuse resistor is made of nichrome.

5. A semiconductor fused ROM according to claim 1, wherein said fuse resistor is made of molybdenum.

* * * * *